United States Patent
Ono

[11] 3,942,867
[45] Mar. 9, 1976

[54] OPTICAL MEMORY APPARATUS
[75] Inventor: Yuzo Ono, Tokyo, Japan
[73] Assignee: Nippon Electric Co., Ltd., Tokyo, Japan
[22] Filed: Dec. 18, 1974
[21] Appl. No.: 533,993

[30] Foreign Application Priority Data
Dec. 27, 1973  Japan.................................. 48-1346
Dec. 27, 1973  Japan........................... 48-1532[U]
Dec. 27, 1973  Japan........................... 48-1533[U]

[52] U.S. Cl...... 350/96 GN; 350/96 R; 340/15.5 DF
[51] Int. Cl.²............................................ G02B 5/14
[58] Field of Search ..... 350/96 R, 96 WG, 175 GN, 350/91 C, 96 CE, 96 GN, 96 B; 106/74 Q

[56] References Cited
UNITED STATES PATENTS
3,801,181  4/1974  Kitano et al. .................. 350/96 GN OTHER PUBLICATIONS
A. N. Rosen, Scanning a TEM Mode Laser Beam Through Selfoc Fibers Apr. 1972, pp. 946–947. Applied Optics–Vol. 11, No. 4.

Aagard, Advance Optical Storage-Techniques for Computers, Oct. 1972, Vol. 11, No. 10 Applied Optics pp. 2133–2139.

*Primary Examiner*—Alfred E. Smith
*Assistant Examiner*—B. W. delos Reyes
*Attorney, Agent, or Firm*—Hopgood, Calimafde, Kalil, Blaustein & Lieberman

[57] ABSTRACT

An optical memory includes a light beam source, converting means for causing the light beam to take on a predetermined spot size, and a light-focusing fiber guide having a refractive index distribution decreasing radially outwardly from its center axis. A memory medium is arranged to be irradiated by an output beam from the fiber guide. The fiber guide has input and output end faces perpendicular to the direction from which the light beam irradiates the surface of the memory medium. The length of the fiber guide is equal to an integral multiple and a half-integral multiple, respectively, of the characteristic propogation pitch of the fiber guide corresponding to conditions in which the directions of the input and output beams are anti-parallel and parallel.

8 Claims, 6 Drawing Figures

OPTICAL MEMORY APPARATUS

BACKGROUND OF THE INVENTION

This invention relates to an optical memory apparatus capable of performing write-in and read-out operations with a light beam, and more particularly to an optical memory apparatus with a compensation function for the irradiation position of a light beam on a memory medium.

Recently, optical memory apparatus have come to be regarded as suitable for large-scale, high density information storage devices due particularly to the focusing capability of light beams. In such an optical memory apparatus, means for providing light beam access to a desired memory position in an information memory medium is important. A method resorting only to the operation of a light deflector can achieve the highest access speed. However, since a light deflector with a number of deflection points has not as yet been developed, an optical disc memory apparatus or an optical drum memory apparatus in which access to a desired memory position is carried out by the mechanical rotation of a memory medium in combination with the deflection by a light deflector is used in place of a memory apparatus with only a light deflector.

Generally, in an optical memory apparatus, to achieve an inherently high memory density, a light beam is focused on an information memory position with a diameter of the order of several microns, and, as a result, a position deviation of a disc rotary shaft of an optical disc memory apparatus in the direction parallel to the disc plane or a position deviation of a drum rotary shaft in an optical drum memory apparatus in the direction in which said rotary shaft extends will result in an off-track condition between the light beam and an information memory track. This off-track situation has been a serious problem. To solve this problem, a method of compensating for the deviation by detecting the position deviation and negatively feeding back the detected signal to the light deflector, and another method of employing an air bearing with a high precision in a rotating mechanism have been proposed.

An example of a specific prior art method is the optical memory system "UNICON" disclosed in an article titled "Laser Mass Memory System" published in "IEEE TRANSACTIONS ON MAGNETICS", September issue, 1972, Vol. 8, No. 8, pp. 416–420. An example of the latter method is seen in an article titled "Advanced Optical Storage Techniques for Computers" published in "Applied Optics", (1972) Vol. 11, No. 10, pp. 2133–2139.

However, the first method has the disadvantage that very complicated optical and electro-mechanical means are required with the result that the apparatus becomes costly to manufacture and the response speed is comparatively low. The second method also has a disadvantage in that the accuracy is very low. Furthermore, even when a static memory medium is employed without introducing the mechanical rotation of the above-described memory medium, the arrangement of the optical system varies due to vibration resulting from variations of the irradiating position of the light beam. Consequently, it is necessary that the optical system be installed on a massive optical bench. It is, therefore, very difficult to increase the storage density of the optical memory apparatus to fully utilize the focusing capability of a light beam.

It is, therefore, an object of the present invention to provide an optical memory apparatus with a novel compensating mechanism for a light beam irradiating position capable of realizing a high density memory by the use of the focusing capability of a light beam free from the disadvantages of the prior art optical memory apparatus described above.

SUMMARY OF THE INVENTION

The optical memory apparatus of the present invention comprises: a light source for providing a light beam and means for causing said light beam to have a predetermined spot size. A light-focusing fiber guide is provided for propagating said converting light beam, the fiber guide having a refractive index distribution decreasing radially from its center axis toward its outer surface. A memory medium, which may be a drum or a disc, is secured to a part of the fiber guide and adapted to be irradiated by the beam propagated through the fiber guide. The input and output end faces of the fiber guide which intersect with its center axis at right angles are perpendicular to the direction of the irradiation of the memory medium by said propagated beam, and the length of the fiber guide is related to a characteristic propagation pitch of the fiber guide by a factor of an integral and a half integral, respectively, corresponding to conditions in which the directions of the input and output beams are anti-parallel and parallel. Deviation of an irradiating position of the light beam on the memory medium caused by a position deviation of the memory medium can be compensated due to the refractive index distribution.

A notable characteristic of the present invention is that the light-focusing fiber guide with a refractive index distribution decreasing radially outwardly from its center axis up to its outer circumference has a function of converting the incident position and incident direction of an input beam into any arbitrary emitting position and emitting direction. That is, a light beam deflecting function is performed. By securing the fiber guide to a part of a memory medium, the deviation in the relative positioning between the memory medium and the light beam can be sensed as a displacement of the incident position on the input end face of the fiber guide. More particularly, the present invention is based on the principle that by selecting an appropriate length for the light-focusing fiber guide relative to its characteristic propagation pitch, in response to deviation in the relative positioning between the memory medium and the light beam sensed as the displacement of the incident position on the input end face of the guide, the emitting position on the output end face of the guide is displaced by just such an amount that the deviation in the relative positioning between the memory medium and the light beam is compensated. Thus, the beam emitted from the guide will always irradiate the same position on the memory medium.

BRIEF DESCRIPTION OF THE DRAWING

For a more complete description of the present invention, reference may be had to the detailed description which follows taken in conjunction with the accompanying drawings wherein.

DESCRIPTION OF THE PREFERRED EMBODIMENTS

Figure 1:
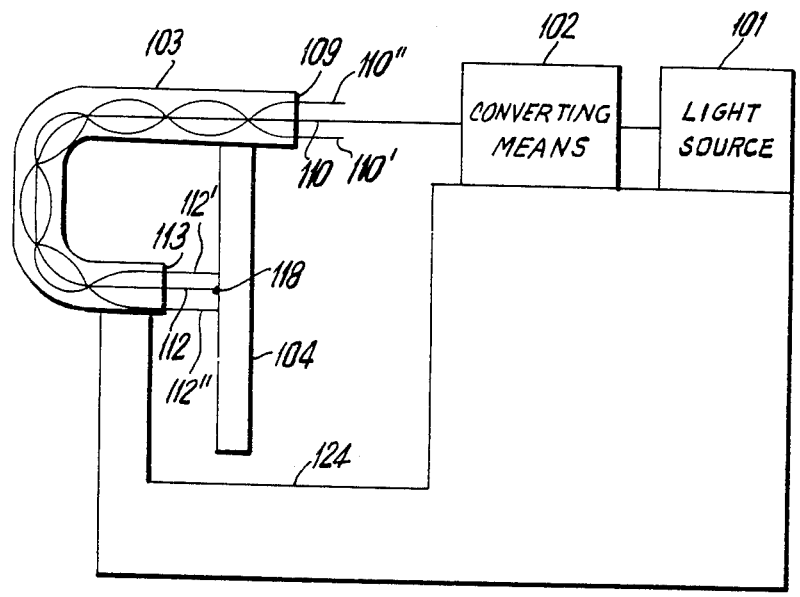
FIG. 1 shows a schematic side view, partly in cross-section, of a first embodiment of the invention.

FIG. 1 shows an optical memory apparatus composed of a light source 101, spot size converting optical means 102 formed by a single lens, a memory medium 104, and flexible light-focusing fiber guide 103 with its input end secured to the memory medium 104 in such a manner that its input end face can be maintained at a right angle to the direction of the light beam for irradiating the memory medium with its output end fixedly mounted on a support base 124 together with the light source 101 and the optical means 102. It is to be noted here that conventional structural elements that also are part of the optical memory apparatus (for example, a light modulator, a light deflector, a light detector, etc.) are omitted from the description here because they are not necessary to an understanding of the present invention.

A light beam emitted from the light source 101 is converted by the optical means 102 so that the converted light beam will arrive at the fiber guide 103 with the spot size of a fundamental propagation mode of the guide 103, and thus enter the fiber guide 103. If memory medium 104 is disposed in a position relative to the light beam such that the light beam may enter the guide 103 along its center axis 110, the light beam is propagated along the center axis 110 of the guide 103 and is emitted from an output end face 113 of the guide 103 as an output light beam 112 to irradiate position 118 on the memory medium 104.

If the memory medium 104 is displaced downwardly, the light beam arrives at the input end face 109 along a light beam locus 110'' and is propagated through the guide 103 while oscillating with a period equal to its characteristic propagation pitch, which is equal to one full propagation wavelength of the sinusoidal path of the light beam inside the light guide (referred to herein as "propagation pitch") as shown in FIG. 1. It is emitted from the output end face 113 along a light beam locus 112'', whereby the emitted light beam will irradiate a position displaced by the same amount in the same direction as the displacement of the memory medium 104. That is, it can irradiate the same position on the memory medium 104 as when the memory medium 104 is not displaced.

On the other hand, when the memory medium 104 is displaced upwardly, the light beam goes along a light beam locus 110' and is emitted along a light beam locus 112' as shown in FIG. 1, resulting in the irradiation of the same irradiating position as when the memory medium 104 is not displaced. This is equally true when the memory medium 104 is displaced in the direction perpendicular to the plane of FIG. 1. In this way, the entire displacement of the medium 104 along a plane perpendicular to the light beam 110 can be compensated for. It should be noted that in FIG. 1, the length of the fiber guide 103 is selected to be equal to an integral multiple of its inherent propagation pitch. While the direction of the input beam with respect to the guide 103 and the direction of the output beam proceeding therefrom are anti-parallel to each other as shown in FIG. 1, if the directions of the input output beams are identical (or parallel) to each other (in other words, in a case in which, in the arrangement shown in FIG. 1, the memory medium is irradiated from its right side the length of the guide 103 must be selected to be equal to a half-integral multiple [that is $(N + \frac{1}{2})$, where N is an integral] of the propagation pitch.

In this embodiment, the light source 101 may be, for example, an argon laser [an oscillation wave length of 4880A (Angstroms), an oscillation mode of $TEM_{00}$ and a spot size on a mirror on the reflecting side of the resonator of 631 microns in radius]. Also, the spot size converting means 102 may be formed by a single lens with a focal length of 4.97 centimeters at a distance 150 centimeters from the mirror on the reflecting side of the resonator, and as a result, at a distance of 5.01 centimeters from this lens, the aforementioned laser beam is converted into a beam waist with a spot size of 10.5 microns. Subsequently, if the input end face 109 of the light-focusing optical guide consisting of optical fibers having a propagating spot size of 10.5 microns, a radius of 200 microns and a propagation pitch of 7.12 millimeters is established at the above-mentioned position, and if the length of the guide is selected to be equal to 50 times its propagation pitch, that is, 35.6 centimeters, the optical memory apparatus with the compensating capability for a light beam irradiating position as illustrated in FIG. 1 can be constructed. With regard to the light deflecting function, the spot size in the fundamental propagation mode and the characteristic propagation pitch of the above-described guide 103, a detailed description is found in an article titled "Imaging of Optical Modes - Resonators with Internal Lenses" published in "Bell System Technical Journal", (1965) Vol. 44, No. 3, pp. 455–494, and accordingly, a more detailed description will not be given here. An example of a practical employment of the guide 103 as a light deflecting device is disclosed in an article titled "Scanning a $TEM_{00}$ Mode Laser Beam Through SELFOC Fibers" published in "Applied Optics", (1972) Vol. 11, No. 4, pp. 946–947.

In the first embodiment, it may be desired to replace the memory medium 104, that is, the memory medium 104 may be replaced by another, if necessary, to read out and write in information. To replace the medium 104 by another and to reset the new memory at the original position with high precision, it is desirable to maintain the input end of the light-focusing fiber guid 103 secured to the memory medium 104 while replacement is carried out. However, since the output end of the guide 103 is fixedly mounted on the support base 124 together with the light source 101 and the spot size converting optical means 102, the replacement of the medium 104 is very difficult. In such cases, it is desirable to divide the light-focusing fiber guide into two parts, that is, a first light-focusing fiber guide with a minimum allowable length that can be replaced while being secured to the memory medium 104 by a similar member of another memory medium secured thereto, and a second light-focusing fiber guide fixedly mounted on the support base 124. Such a modified embodiment will be described hereinunder with reference to FIGS. 2 and 3.

Figure 2:
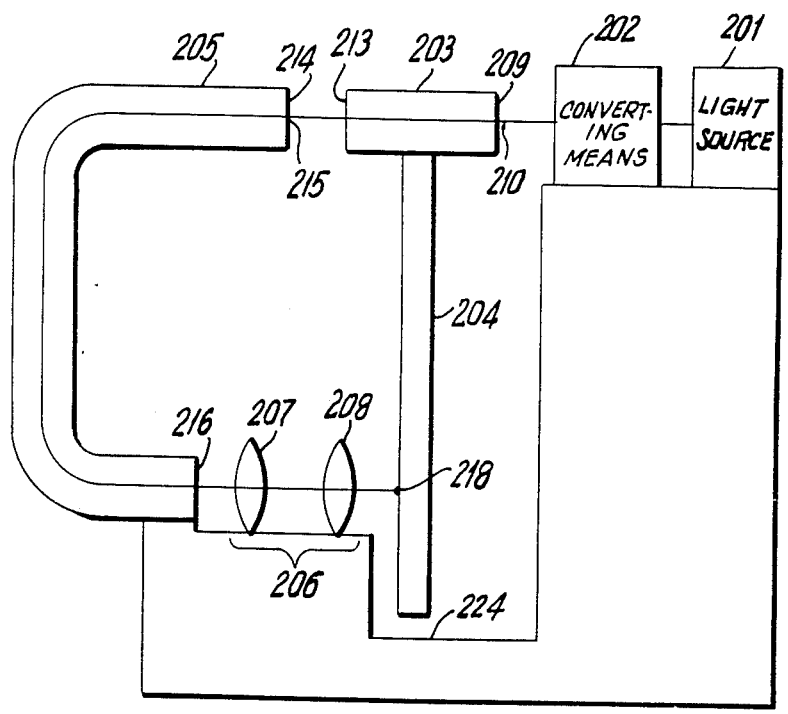
FIG. 2 shows a schematic side view, partly in cross-section, of a second embodiment of the invention.
Figure 3:
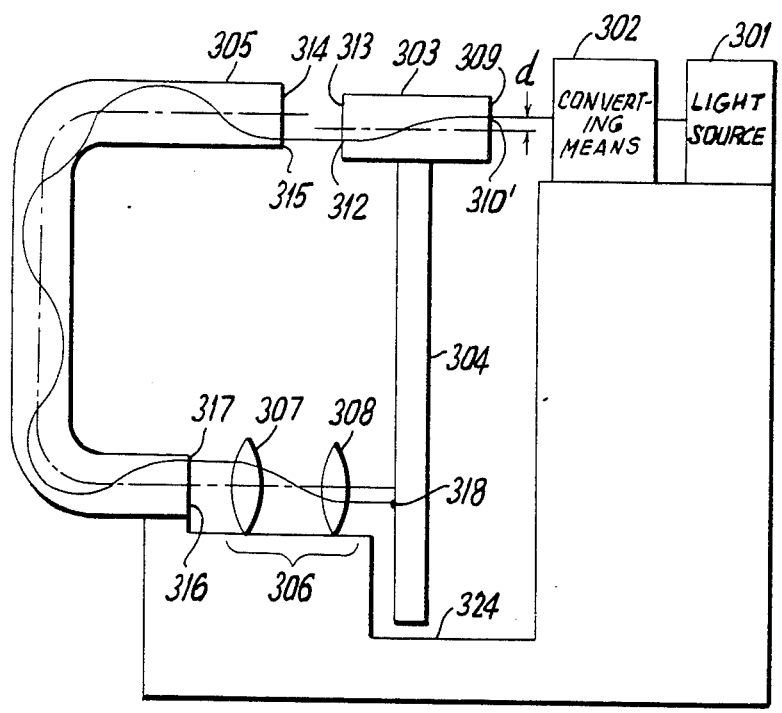
FIG. 3 shows another schematic side view, partly in cross-section, illustrating the light beam irradiating position compensating capability of the apparatus shown in FIG. 2.

In FIGS. 2 and 3, similar structural elements are denoted by like reference numerals with the highest order digits changed to 2 and 3 in FIGS. 2 and 3, respectively.

In FIG. 2, which shows the propagation route of a light beam in the absence of a position deviation of a memory medium, the present optical memory apparatus is formed by a light source 201, spot size converting optical means 202 consisting of a single lens, a memory medium 204, a first light-focusing fiber guide 203 secured to a part of the memory medium 204, a second light-focusing fiber guide 205, and reducing optical means 206 fixedly mounted on a support base 224 together with the light source 201, the spot size converting optical means 202 and the fiber guide 205. The optical means 206 is formed by a lens 207 with a focal length $f$ and another lens 208 with a focal length $f/2$ disposed at a distance of $f/2$ from an irradiating surface of the memory medium 204, and the respective lenses are separated from each other by $3/2 f$. It is to be noted that other well-known structural elements that form part of a complete optical memory apparatus are omitted from the description, as in the case of the embodiment shown in FIG. 1.

A light beam radiated from the light source 201 is converted by the optical means 202 so that the converted light beam may arrive at the guide 203 with a spot size of a fundamental propagation mode of the guide 203, and the incident light beam is propagated along its center axis 210 and subsequently, along a center axis 215 of the second light-focusing fiber guide 205. Thereafter, the light-beam is propagated along the center axis of the optical means 206, and is focused on an irradiating position 218 on the memory medium 204.

Since FIG. 2 is not well suited for explaining the lengths of the guides 203 and 205, reference is now made to FIG. 3, which shows a state in which the memory medium 304 has moved downwardly by a distance $d$ as compared to the state shown in FIG. 2. In FIG. 3, the light beam converted by spot size converting optical means 302 enters a first light-focusing fiber guide 303 at a position 310 on its input end face 309 displaced upward by the distance $d$ from the position on its center axis, and the light beam is propagated therethrough. The length of the guide 303 is selected to be equal to a half-integral multiple [that is, a multiple of $(N + \frac{1}{2})$, where N represents an integer] of its characteristic propagation pitch, so that the light beam entering the guide 303 at the incident position 310 is emitted from an emitting position 312 on its output end face 313 displaced downward by the distance $d$ from the position on said center axis. As a result, the light beam emitted from the guide 303 is made incident upon a second light-focusing fiber guide 305 at a position 315 on its input end face 314 displaced downwardly by a distance $2d$ from the position on its center axis, and the light beam is propagated therethrough.

The length of the guide 305, which has a configuration in which light beams enter and leave the guide in parallel directions, is selected to be equal to an integral multiple of its propagation pitch, so that the light beam incident on the guide 305 at the incident position 315 is emitted from an output position 317 on its output end face 316 displaced upward by the distance $2d$ from the position on its center axis. Next, the distance between the light beam emitted from the output position 317 and the center axis of the guide 305 (as measured along a direction perpendicular to the center axis) is reduced by a factor of one-half and reversed by reducing optical means 306. Therefore, the position deviation of the memory medium 304 is precisely compensated and the finally emitted light beam is focused on the same irradiating position 318 (the same position as the irradiating position 218 in FIG. 2) on the medium 304 as in the absence of the displacement of the guide 303 with respect to the initial incident light beam. Similarly, all the position deviations of the memory medium 304 perpendicular to the direction of the irradiating beam can be compensated by the above-mentioned operation. Although the illustrated embodiment has been described with respect to an arrangement which the directions of the input and output beams are antiparallel, it will be clear from these drawings that it is only necessary to select the length of the fiber guide 205 (305) to be equal to a half-integral multiple of its propagation pitch if the directions of the input and output beams are parallel to each other, that is, if the light beam irradiates the memory medium 205 (305) from its right side as viewed in FIG. 2. Although this embodiment has been explained with respect to an arrangement in which the optical means 306 is an inverting optical system, the length of the guide 305 must be changed by an amount equal to one-half of the characteristic propagation pitch with respect to the above-described length, if there exists no such inversive relationship between the guide 305 and the memory medium 304. According to the abovedescribed second embodiment of the present invention, through the step of replacing the memory medium 304 as secured to the guide 303 by another memory medium that is secured to a similar light-focusing fiber guide, the same position in the surface of another memory as on the original memory medium can be irradiated without necessitating the accurate reproduction of an original position of the memory medium 304. Thus, in this second embodiment, the replacement of the memory medium is readily accomplished.

In the embodiment of FIG. 3, the light source 301 and the optical means 302 may be made of elements corresponding to those used in the first embodiment. Likewise, the first light-focusing fiber guide 303 may correspond to that employed in the first embodiment in a length 1.5 times as large as its propagation pitch, i.e., 10.68 millimeters, and secured to the memory medium 304. The second light-focusing fiber guide 305 may be formed of the same material as the guide 303 in a length of 50 times as large as its propagation pitch, i.e., 35.6 centimeters, and the interval between the first and second light-focusing fiber guides is chosen to be about 10 microns so that the light beam may enter the second light-focusing fiber guide with a spot size almost equal to the spot size of the output beam emitted from the first light-focusing fiber guide. Also, a single lens with a focal length of 15 millimeters is disposed at a distance of 15 millimeters from the output end face 316 of the guide 305, and another single lens with a focal length of 7.5 millimeters is disposed at a distance of 22.5 millimeters from the first single lens, whereby the spot size on the memory medium disposed at a distance of 7.5 millimeters from the single lens with a focal length of 7.5 millimeters will be 5.25 microns.

It will be understotod from the foregoing that the present invention is very effective if employed in an optical drum memory apparatus or an optical disc memory apparatus, and, if the memory medium 304 is of the drum type or disc type, the present invention can be effectively applied to the aforementioned optical memory apparatus.

Figure 4:
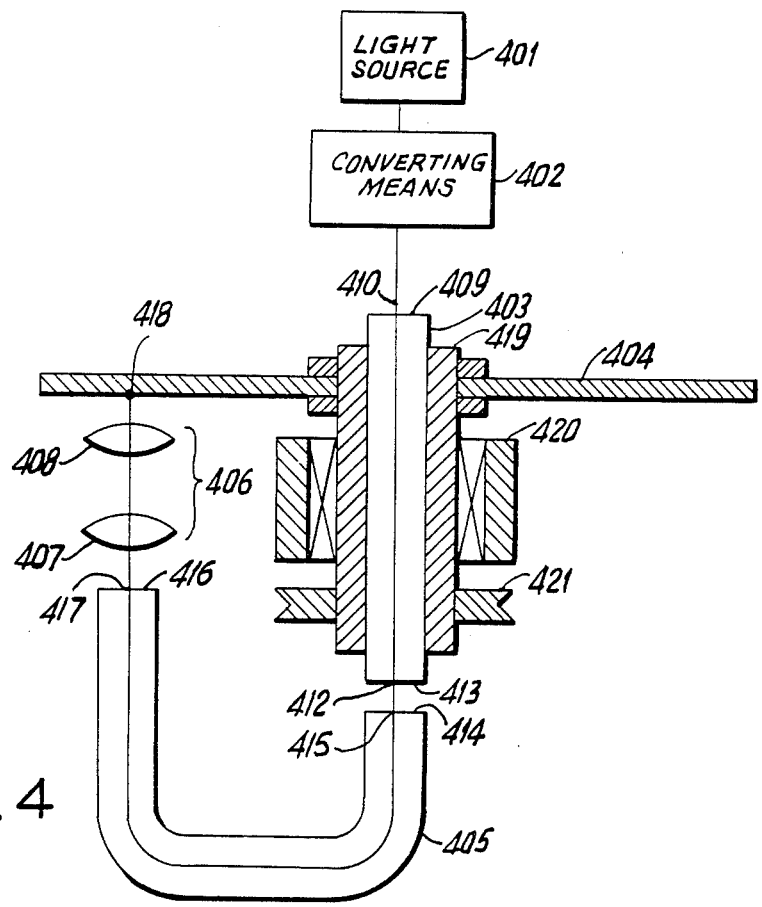
FIG. 4 shows a side view, partly in cross-section, of one example of an application of the present invention to an optical disc memory apparatus.

Next, the present invention will be explained as applied to disc and drum memory apparatus. FIG. 4 shows an example of the application of the above-mentioned second embodiment of the present invention to an optical disc memory apparatus which includes a light source 401, spot size converting optical means 202 consisting of a single lens, a memory medium disc 404, a rotary shaft 419 for the disc, a bearing 420, a pulley 421 for driving the disc, and a first light-focusing fiber guide 403 secured to the disc rotary shaft 419. The center axis of the first light-focusing fiber guide 403 is aligned with the central axis of rotation of the disc rotary shaft 419. A second light-focusing fiber guide 405 is optically coupled to the guide 403, and reducibly converting optical means 406 is provided for converting an output beam emitted from the guide 405, which is formed by a lens 407 with a focal length $f$ and another lens 408 with a focal length $f/2$ disposed at a distance of $f/2$ from an irradiating surface of the disc 404. The above-mentioned lenses are separated from each other by $3/2 f$. It should be noted that other well-known component elements required for the present optical memory apparatus are omitted in the description, because they are not necessary to an understanding of the present invention.

FIG. 4 shows the propagation route of a light beam in the absence of the position deviation of the axis of the disc rotary shaft 419. A light beam emitted from the light source 401 is converted by the optical means 402 so that the converted light beam will arrive at the guide 403 with a spot size of a fundamental propagation mode of the guide 403, and the incident light beam is propagated along its center axis 410. The light beam enters the guide 405 to be propagated along its center axis, and is then propagated along a center axis of the optical means 406 and focused at an information memory position 418 on the disc 404.

Figure 5:
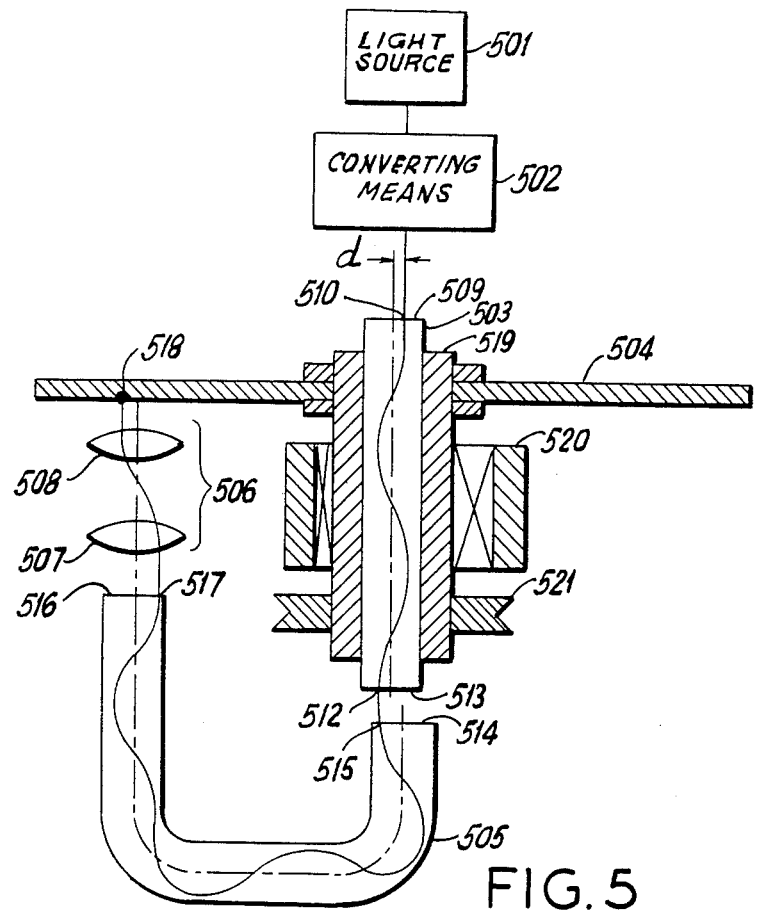
FIG. 5 shows another side view, partly in cross-section, that illustrates the light beam irradiating position compensating capability of the embodiment shown in FIG. 4.

FIG. 5 shows exactly the same optical disc memory apparatus as shown in FIG. 4. Similar structural elements are denoted by like reference numerals with the highest order digit changed to 5.

In FIG. 5, which shows a state in which the axis of a disc rotary shaft 519 has deviated leftwardly as viewed in this figure by a distance $d$ in contrast to the state shown in FIG. 4, the light beam converted by spot size converting optical means 502 enters a first light-focusing fiber guide 503 at a position 510 on its input end face 509 displaced rightwardly by a distance $d$ from the position on its center axis, and the light beam is propagated therethrough. The length of the guide 503 is selected to be equal to a half-integral multiple [a multiple of $(N + \frac{1}{2})$, where $N$ represents an integral] of its characteristic propagation pitch, so that the light beam entering the guide 503 at the incident position 510 is emitted from an emergance point 512 on its output end face 513 displaced leftwardly as viewed in the figure by the distance $d$ from the position on said center axis. As a result, the light beam emitted from guide 503 enters a second light-focusing fiber guide 505 at a position 515 on its input end face 514 displaced leftwardly by a distance $2d$ from the position on its center axis, and the light beam is propagated therethrough.

The length of the guide 505 is selected to be equal to an integral multiple of its propagation pitch, so that the light beam entering the guide 505 at the incident point 515 is emitted from an output point 517 on its output end face 516 displaced rightwardly by the distance $2d$ from the position on its center axis. Then, the distance between the light beam emitted from the output position 517 and the center axis of the guide 505 as measured in a direction perpendicular to the center axis is reduced by a factor of one-half and inverted in direction by reducibly converting optical means 506. Therefore, the position deviation of the axis of the disc rotary shaft 503 can be compensated for, and the finally emitted light beam is focused on the same information memory position 518 as in the case of zero deviation of the axis. Similarly, all the position deviations of the axis of rotation of the disc rotary shaft 519 caused by a translation in any direction perpendicular to the center axis can be compensated for by the above-described arrangement. Although this embodiment has been described with respect to an arrangement in which the directions of the input and output beams of the guide 505 are anti-parallel, it is only necessary to make the length of the guide 405 (505) equal to a half-integral multiple of its propagation pitch when the input and output beams are parallel to each other, that is when the light beam is focused to irradiate the upper surface of the disc 404 (504) (FIGS. 4 and 5 referred to). Moreover, while the illustrated embodiment has been described above with respect to the case in which the optical means 506 is an inverting optical system, the length of the guide 505 must be changed by an amount equal to one-half the propagation pitch with respect to the above-described length, if there exists no such inversive relationship between the guide 505 and the disc 504. Still further, in this embodiment, the first light-focusing fiber guide 503 is secured to the disc rotary shaft 519, but the guide 503 can be secured to the disc 504 per se along its center axis so that the guide 503 may be mounted to or detached from the disc rotary shaft 517 jointly with the disc 504. This facilitates recovery of the disc mounting position after replacement of the disc.

In this embodiment, the light source 501 and the optical means 502 may be constructed of elements corresponding to those used in the first embodiment. Likewise, the first light-focusing fiber guide 503 may correspond to that employed in the first embodiment with a length of 30.5 times its propagation pitch, i.e., 21.716 cm., and secured within a central bore of the disc rotary shaft 519. Also, the distance between the output end face 513 of the guide 503 and the input end face 514 of the second light-focusing fiber guide 505 is chosen to be about 10 microns so that the light beam may enter the guide 505 with a spot size almost equal to the spot size of the output beam emitted from the first light-focusing fiber guide. The guide 505 may be formed of the same material as the guide 503 with a length of 50 times its propagation pitch, i.e., 35.6 centimeters, and a single lens with a focal length of 15 millimeters is disposed at a distance of 15 millimeters from the output end face 516 of the second light-focusing fiber guide. Moreover, by disposing another single lens with a focal length of 7.5 millimeters at a distance of 22.5 millimeters from said first single lens, the spot size on the disc surface placed at a distance of 7.5 millimeters from the other single lens with a focal length of 7.5 millimeters can be made equal to 5.25 microns.

Figure 6:
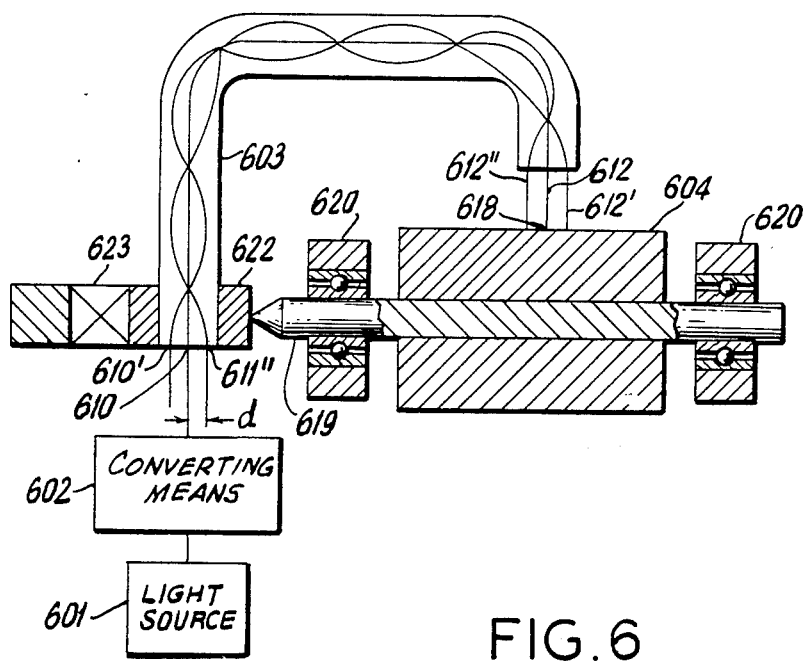
FIG. 6 shows a side view, partly in cross-section, of another example of an application of the present invention to an optical drum memory apparatus.

FIG. 6 shows one example of an application of the first embodiment of the present invention to an optical drum memory apparatus. The illustrated optical drum memory apparatus is formed by a light source 601, spot size converting optical means 602 consisting of a single lens, a light-focusing fiber guide 603, rotary shaft deviation transmission means including a support 622 for the guide 603, a drum rotary shaft 619 and spring 623, a memory medium drum 604 and a bearing 620. Other well-known structural elements required for the optical memory apparatus are omitted in the description to avoid unnecessary complexity in this explanation. A light beam emitted from the light source 601 is converted by the optical means 602 so that the converted light beam may enter the guide 603 with a spot size of a fundamental propagation mode of the guide 603. When the light beam enters the guide 603 at a position 610 along its center axis, the light beam is propagated along the center axis of the guide 603 and is emitted from the output end face at a position 612 with access to an information memory position 618 on the drum surface. If the drum rotary shaft 619 has been displaced axially leftwardly by a distance $d$, the input end portion of the guide 603 is displaced leftwardly by the distance $d$ via said deviation transmission means (drum rotary shaft 619, support 622 and spring 623) in response to the deviation of the drum rotary shaft 619. Therefore, the light beam goes to the guide 603 at a position 611'' on the input end face displaced rightwardly by a distance $d$ from its center axis, and it is propagated therethrough. Since the length of the guide 603 is selected to be equal to an integral multiple of its propagation pitch, the light beam is emitted from a position on the output end face displaced leftwardly by a distance $d$ from the position on its center axis in the direction denoted by reference numeral 612''. As a result, access is had to the same information memory position 618 as in the case of zero shaft deviation. Even though the drum rotary shaft deviates in the direction opposite to that in the above-described case, access is made to the same information memory position 618. While the direction of the input beam and the output beam of the guide 603 are anti-parallel in FIG. 6, it is only necessary to select the length of the guide 603 to be equal to a half-integral multiple $[(N + ½)$, where $N$ is an integer] of its propagation pitch when the directions of the input beam and the output beam are the same, that is, when access to the drum from its under side, as viewed in FIG. 6, is had by a light beam. Thus, as in the preceding embodiments the length of the fiber guide is a function of its characteristic propagation pitch and its configuration.

In this embodiment, the light source 601 and the optical means 602 may be constructed of elements corresponding to those used in the first embodiment. Also, the guide 603 may correspond to one employed in the first embodiment with a length of 50 times its propagation pitch, that is, 35.1 centimeters. The optical drum memory apparatus as shown in FIG. 6 can be constructed in this way.

Although no description of a specific memory medium has been given with respect to above embodiments, a large number of materials are known to be useful as memory media. For instance, materials such as silver halide, photo-resist, photo-chromic material, liquid crystal material, metallic thin film and magnetic thin film, can be used for that purpose.

With regard to light beam access, it can be achieved in the following ways. In a first method, making use of the flexibility of the light-focusing fiber guide, an output end of the light-focusing fiber guide in the case of the first embodiment and the application to the optical drum memory apparatus, and an output end of the second light-focusing fiber guide jointly associated with the reducing optical means in the case of the second embodiment and the application to the optical disc memory apparatus, respectively, are scanned to a desired position on the memory medium. However, according to this method, not only is scanning precision required, but access time is prolonged because of mechanical scanning. In a second method, the light-focusing fiber guide for compensating for the deviation of an irradiating position used in the present invention is provided for each access point (each track in the application of the invention to the optical disc and drum memory apparatus, and the input beam to the light-focusing fiber guides is switched by means of a light deflector. According to this second method, however, a large number of light-focusing fiber guides must be used. The most desirable access method is to use the light-focusing fiber guides as a multiplex optical guide. Assuming that a diameter of the light-focusing fiber guide is denoted by D, a fundamental propagation spot size (in radius) of the fiber guide by W, and the maximum deviation of the irradiating position to be compensated for by $\pm S$, the fiber guide can guide $D/(2W + 2S)$ light beams independently of one another, and the compensation for the irradiating position can be achieved as described above. Accordingly, a high access speed can be accomplished by varying the input position to the light-focusing fiber guide (the first light-focusing fiber guide in the second embodiment and in the application to the optical disc memory apparatus) with a light deflector. The possibility of employing the light-focusing fiber guide as the above-described multiplex optical guide, is found in the above referenced article, "Scanning a $TEM_{00}$ Mode Laser Beam Through SELFOC Fibers".

It will be apparent to those skilled in the art that the embodiments described above are intended to be merely exemplary and that the specific structure is susceptible of numerous modifications and variations without departing from the spirit and scope of the invention.

I claim:

1. An optical memory apparatus comprising: a light source for providing a light beam; converting means for causing the light beam to take on a predetermined spot size; a light-focusing fiber guide arranged so that input and output light beams are parallel or anti-parallel and having a refractive index distribution decreasing radially outwardly from its center axis toward its surface arranged to propagate the light beam emitted from the converting means; and a memory medium positioned to be irradiated by a beam propagated through the fiber guide; wherein the length of the fiber guide is related to its characteristic propagation pitch and configuration such that possible deviation of the irradiating position of the light beam on the memory medium caused by a position deviation of the memory medium relative to the fiber guide is corrected by an equivalent displacement of the irradiating position relative to the fiber guide due to the light beam locus followed by the irradiating light.

2. The optical memory apparatus of claim 1, wherein the configuration of the fiber guide is such that the light beams entering and leaving the fiber guide are parallel, the length of the fiber guide being a half-integral multiple of its propagation pitch.

3. The optical memory apparatus of claim 1, wherein the configuration of the fiber guide is such that the light beams entering and leaving the fiber guide are anti-parallel, the length of the fiber guide being an integral multiple of its propagation pitch.

4. The optical memory apparatus of claim 1, wherein the fiber guide has input and output ends perpendicular to its center axis.

5. An optical memory apparatus comprising: a light source for providing a light beam; converting means for causing the light beam to take on a predetermined spot size; a first light-focusing fiber guide having a refractive index distribution decreasing radially outwardly from its center axis toward its outer surface arranged to propagate the light beam emitted from the converting means; a second light-focusing fiber guide arranged so that input and output light beams are parallel or anti-parallel and having a refractive index distribution decreasing radially outwardly from its center axis toward its outer surface arranged to propagate the light beam emitted from the first light-focusing fiber guide; optical means arranged to receive the beam emitted from the second light-focusing fiber guide for reducing by one-half the distance between the center axis of the second light-focusing fiber guide and said emitted beam as measured in a direction perpendicular to said center axis; and a memory medium arranged to be irradiated by a light beam emitted from said optical means; wherein the length of the first light-focusing fiber guide is related to its characteristic propagation pitch and configuration and the second light-focusing fiber guide also has a length related to its characteristic propagation pitch and configuration such that possible deviation of an irradiating position of the light beam incident on the memory medium caused by a position deviation of the memory medium relative to the second fiber guide is corrected by an equivalent displacement of the irradiating position relative to the second fiber guide due to the light beam locus followed by the irradiating light in the first and second fiber guides.

6. The optical memory apparatus of claim 5, further comprising an inverting optical system disposal between the second light-focusing fiber and the memory medium, the inverting optical system affecting the length of a fiber guide by one-half the propagation pitch thereof.

7. An optical disc memory apparatus comprising: a light source for providing a light beam; converting means for causing said light beam to take on a predetermined spot size; a first light-focusing fiber guide having a refractive index distribution decreasing radially outwardly from its center axis toward its outer surface arranged to propagate the light beam emitted from the converting means; a second light-focusing fiber guide arranged so that input and output light beams are parallel or anti-parallel and having a refractive index distribution decreasing radially outwardly from its center axis toward its outer surface arranged to propagate the light beam emitted from the first light-focusing fiber guide; optical means arranged to receive the light beam emitted from the second light-focusing fiber guide for reducing by one-half the distance between the center axis of the second light-focusing fiber guide and said emitted beam as measured in a direction perpendicular to said center axis; and a disc shaped memory medium arranged to be irradiated by the light beam emitted by the optical means including a rotary disc shaft for rotating the disc-shaped memory medium; wherein the center axis of the first light-focusing fiber guide and the center axis of the rotary disc shaft are aligned and the first light-focusing fiber guide is connected to the disc-shaped memory medium; the length of the first light-focusing fiber guide being related to its characteristic propagation pitch and configuration and the length of the second light-focusing fiber guide likewise being related to its characteristic propagation pitch and configuration such that possible deviation of an irradiating position of the light beam on the memory medium relative to the second fiber guide is corrected by an equivalent displacement of the irradiating position of the second fiber guide due to light beam locus followed by the irradiating light in the first and second fiber guides.

8. An optical drum memory apparatus comprising: a light source for providing a light beam; converting means for causing said light beam to take on a predetermined spot size; a light-focusing fiber guide arranged so that input and output beams are parallel or anti-parallel and having a refractive index distribution decreasing radially outwardly from its center axis toward its outer surface arranged to propagate the light beam emitted by the converting means; a drum-shaped memory medium arranged to be irradiated by a beam emitted from the fiber guide; a rotary shaft on which the drum-shaped memory medium is mounted; and axial deviation transmission means for transmitting the axial deviation of the rotary shaft to the fiber guide; wherein the fiber guide has input and output end faces perpendicular to the direction from which the light beams irradiates the surface of the memory medium, and the length of the fiber guide is related to its characteristic propagation pitch and configuration such that possible deviation of the irradiating position of the light beam on the memory medium caused by a position deviation of the memory medium relative to the fiber guide is corrected by an equivalent displacement of the irradiating position of the fiber guide due to the light beam locus followed by the irradiating light in the fiber guide.

* * * * *

UNITED STATES PATENT OFFICE
CERTIFICATE OF CORRECTION

Patent No. 3,942,867  Dated March 9, 1976

Inventor(s) Yuzo Ono

It is certified that error appears in the above-identified patent and that said Letters Patent are hereby corrected as shown below:

The name of the assignee should read:

--Nippon Selfoc Company, Limited--.

Signed and Sealed this

Thirteenth Day of July 1976

[SEAL]

Attest:

RUTH C. MASON
*Attesting Officer*

C. MARSHALL DANN
*Commissioner of Patents and Trademarks*